United States Patent
Bjoern-Josefsen et al.

(10) Patent No.: US 9,967,663 B2
(45) Date of Patent: May 8, 2018

(54) LOUDSPEAKER PROTECTION AGAINST EXCESSIVE EXCURSION

(71) Applicant: Texas Instruments Incorporated, Dallas, TX (US)

(72) Inventors: Anker Bjoern-Josefsen, Hellerup (DK); Lars Risbo, Hvalsoe (DK); Theis Christiansen, Solroed (DK)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 14/956,492

(22) Filed: Dec. 2, 2015

(65) Prior Publication Data

US 2016/0192070 A1    Jun. 30, 2016

Related U.S. Application Data (60) Provisional application No. 62/096,691, filed on Dec. 24, 2014.

(51) Int. Cl.
| | |
|---|---|
| *H04R 3/00* | (2006.01) |
| *H04R 29/00* | (2006.01) |
| *G10L 19/018* | (2013.01) |
| *G10L 21/034* | (2013.01) |
| *H03G 7/00* | (2006.01) |
| *H03G 9/02* | (2006.01) |

(52) U.S. Cl.
CPC .............. *H04R 3/007* (2013.01); *H03G 7/002* (2013.01); *H03G 9/025* (2013.01); *H04R 29/001* (2013.01); *G10L 19/018* (2013.01); *G10L 21/034* (2013.01); *H04R 3/002* (2013.01)

(58) Field of Classification Search
CPC ...... H04R 3/007; H04R 29/001; H04R 3/002; H03G 7/002; H03G 9/025; G10L 19/018; G10L 21/034
USPC ....................................................... 381/55, 59
See application file for complete search history.

(56) References Cited

U.S. PATENT DOCUMENTS

| | | | |
|---|---|---|---|
| 6,865,274 B1 * | 3/2005 | Aarts ..................... | H04R 3/007 381/55 |
| 8,995,673 B2 * | 3/2015 | Mihelich ................ | H04R 3/002 381/55 |
| 2012/0106750 A1 * | 5/2012 | Thormundsson ...... | H04R 3/007 381/71.12 |
| 2012/0278087 A1 * | 11/2012 | Hosokawa ............... | H03G 9/18 704/500 |
| 2015/0023507 A1 * | 1/2015 | Ubale .................... | H04R 3/007 381/55 |
| 2015/0350783 A1 * | 12/2015 | Krishnaswamy ...... | H04R 3/007 381/55 |

(Continued)

*Primary Examiner* — David Ton
(74) *Attorney, Agent, or Firm* — Andrew Viger; Charles A. Brill; Frank D. Cimino (57) ABSTRACT

Systems and methods for loudspeaker protection against excessive excursion are described. In an illustrative, non limiting embodiment, a method may include splitting an input signal into two or more signals, each of the two or more signals within a given frequency band; independently selecting between a power attenuation or an excursion attenuation for each of the two or more signals; independently applying the selected power attenuation or excursion attenuation to each of the two or more signals; combining the attenuated two or more signals into an output signal; and providing the output signal to a loudspeaker.

20 Claims, 7 Drawing Sheets

(56) References Cited

U.S. PATENT DOCUMENTS

| | | | |
|---|---|---|---|
| 2016/0071504 A1* | 3/2016 | Breitschaedel | H04R 3/002 381/94.1 |
| 2016/0157014 A1* | 6/2016 | Van Schyndel | H04R 3/007 381/55 |

* cited by examiner

LOUDSPEAKER PROTECTION AGAINST EXCESSIVE EXCURSION

CROSS-REFERENCE TO RELATED APPLICATIONS

This application claims priority to U.S. Provisional Patent Application Ser. No. 62/096,691 titled "MULTI-BAND ALGORITHM FOR SPEAKER PROTECTION AGAINST DAMAGE DUE TO EXCESSIVE POWER OR EXCURSION" and filed on Dec. 24, 2014, which is incorporated by reference herein.

TECHNICAL FIELD

This specification is directed, in general, to audio systems, and, more specifically, to systems and methods for loudspeaker protection against excessive excursion.

BACKGROUND

Figure 1:
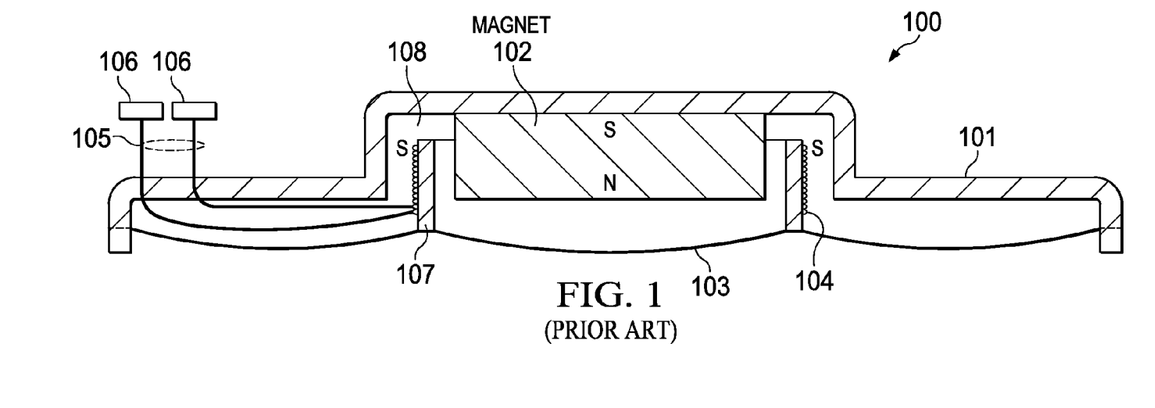
FIG. 1 is a diagram of an example of a conventional loudspeaker.

Loudspeakers are devices that transform an electrical signal into mechanical sound. FIG. 1 shows a cross-sectional view of the main components of loudspeaker 100. Rigid metal frame 101 attaches to magnet 102, which subjects air gap 108 between magnet 102 and frame 101 to a strong magnetic field. Lightweight diaphragm 103 attaches to frame 101 and to cylindrical shaped bobbin 107. Voice coil 104 is wound around bobbin 107, and it attaches through two voice coil wires 105 to two contacts 106. When an electrical current is run through voice coil 104, the magnetic field in air gap 108 interacts with the current in coil 104 to create a force that causes bobbin 107 to move up or down depending on the direction of that current. This physically moves the diaphragm (referred to as "loudspeaker excursion"), which in turn produces air pressure waves that result in audible sound.

Incidentally, loudspeakers are subject to failures resulting from mechanical stress, including voice coil wire breakage, damage of the diaphragm, diaphragm separating from the frame, etc. For instance, the voice coil moves with the diaphragm, but the wires of the voice coil attach to stationary contacts typically mounted on the loudspeaker frame. That is, these various wires move and change shape with every diaphragm movement, or with every sound made by the loudspeaker. And, if the loudspeaker excursion is too great, damage results.

Various technologies exist that reduce the chance of loudspeaker breakage. For example, wires may be given extra length for strain-relief; they may be pre-shaped to allow movement, etc. The loudspeaker may also be designed such that the wires move in free space, away from other surfaces that may cause friction damage.

Despite such technologies, however, loudspeaker components are still subject to mechanical deformation and stress. The inventors hereof have recognized that excessive loudspeaker excursion due to the application of a high power audio signal remains a problem.

SUMMARY

Systems and methods for loudspeaker protection against excessive excursion are described. In any illustrative, non-limiting embodiment, a method may include splitting an input signal into two or more signals, each of the two or more signals within a given frequency band; independently selecting between a power attenuation or an excursion attenuation for each of the two or more signals; independently applying the selected power attenuation or excursion attenuation to each of the two or more signals; combining the attenuated two or more signals into an output signal; and providing the output signal to a loudspeaker.

The method may further include converting the two or more signals from a voltage domain to an excursion domain using a transform operation. In some cases, independently selecting between the power attenuation or the excursion attenuation for a given one of the two or more signals in a given frequency band may include: calculating an inverse root mean square of the given signal and multiplying it by a target root mean square value; calculating an inverse peak excursion estimate for the given signal and multiplying it by a target excursion for the given frequency band; and selecting the smallest calculated value.

The method may also include applying each of the smallest calculated values to its respective one of the two or more signals. Additionally, the method may include applying a lossy watermark to each of the two or more signals to reduce an attenuation swing. The method may also include applying a clipper to each of the two or more signals to saturate each of the two or more signals and applying a low-pass filter to each of the two or more signals prior to combining them to suppress an intermodulation product falling outside of each signal's frequency band.

In various embodiments, the method may include converting the combined signal from the excursion domain to the voltage domain using a transform operation prior to providing the output signal to the loudspeaker. The method may also include monitoring each of the two or more signals; and dynamically selecting a power attenuation or excursion attenuation for each of the two or more signals based upon the monitoring.

In another illustrative, non-limiting embodiment, an electronic circuit may include a controller; and a memory coupled to the controller, the memory having program instructions stored thereon that, upon execution by the controller, cause the controller to: independently select between a power attenuation or an excursion attenuation for each of two or more audio signals, wherein the two or more audio signals are split between different frequency bands; independently apply the selected power attenuation or excursion attenuation to each of the two or more audio signals; and combine the attenuated two or more audio signals into an output signal.

The program instructions may cause the controller to convert the two or more audio signals from a voltage domain to an excursion domain using a transform operation. To independently select between a power attenuation or an excursion attenuation for each of two or more audio signals, the program instructions may cause the controller to: calculate an inverse root mean square of a given audio signal and multiply it by a target root mean square value; calculate an inverse peak excursion estimate for the given audio signal and multiply it by a target excursion for the given audio signal's frequency band; and select the smallest calculated value.

The program instructions may cause the controller to apply each of the smallest calculated values to its respective audio signal. The program instructions may also cause the controller to convert the output signal from the excursion domain to the voltage domain using a transform operation. The program instructions may further cause the controller to: monitor each of the audio signals; and dynamically select a power attenuation or excursion attenuation for each of the audio signals based upon the monitoring.

In yet another illustrative, non-limiting embodiment, an audio device may be configured to: split a received signal into two or more audio signals in different frequency bands; transform the two or more audio signals from a voltage domain to an excursion domain; independently select between a power attenuation or an excursion attenuation for each of two or more audio signals; independently apply the selected power attenuation or excursion attenuation to each of the two or more audio signals; convert the attenuated two or more audio signals from the excursion domain to the voltage domain; and combine the converted more audio signals into an output signal.

To independently select between a power attenuation or an excursion attenuation for each of two or more audio signals, the audio device may be configured to: calculate an inverse root mean square of a given audio signal and multiply it by a target root mean square value; calculate an inverse peak excursion estimate for the given audio signal and multiply it by a target excursion for the given audio signal's frequency band; and select the smallest calculated value. The audio device may be configured to apply each of the smallest calculated values to its respective audio signal. The audio device may also be configured to convert the output signal from the excursion domain to the voltage domain using a transform operation. The audio device may be further configured to: monitor each of the audio signals; and dynamically select a power attenuation or excursion attenuation for each of the audio signals based upon the monitoring.

BRIEF DESCRIPTION OF THE DRAWINGS

Having thus described the invention(s) in general terms, reference will now be made to the accompanying drawings, wherein:

DETAILED DESCRIPTION

The invention(s) now will be described more fully hereinafter with reference to the accompanying drawings. The invention(s) may, however, be embodied in many different forms and should not be construed as limited to the embodiments set forth herein. Rather, these embodiments are provided so that this disclosure will be thorough and complete, and will fully convey the scope of the invention(s) to a person of ordinary skill in the art. A person of ordinary skill in the art may be able to use the various embodiments of the invention(s).

In many implementations, some of the systems and methods disclosed herein may be incorporated into a wide range of audio-enabled electronic devices including, for example, computer systems, portable audio systems, consumer electronics, automotive systems, and professional audio equipment.

Examples of consumer electronics include television sets, A/V receivers, home theater or sound systems, set-top boxes, docking stations, soundbars, sound projectors, etc. Examples of portable audio systems include tablets, smartphones, media players, camcorders, etc. Examples of automotive audio systems include audio distribution, infotainment, in-seat entertainment, etc. Examples of professional audio systems include recording, live and installation sound, musical instruments, etc. It should be noted, however, that these examples are not limiting, but only demonstrative of the various types of systems which may incorporate the present embodiments, and that additional applications may be possible. More generally, these systems and methods may be incorporated into any device or system having one or more electronic audio parts or components.

Turning to FIG. 1, a diagram of an environment where certain systems and methods described herein may be implemented is depicted. As illustrated, one or more devices or systems such as, for example, automobile 102, smartphone 103, A/V receiver 104, and/or audio recording equipment 105 (or any other audio-enabled device or system) may include printed circuit board (PCB) 101 having chip 100 mounted thereon. In some embodiments, chip 100 may include one or more analog, digital, and/or mixed signal integrated circuits (ICs) configured to perform loudspeaker protection against excessive excursion, as discussed in more detail below.

In one embodiment, chip 100 may include an electronic component package configured to be mounted onto PCB 101 using a suitable packaging technology such as Ball Grid Array (BGA) packaging, pin mount packaging, or the like. In some applications, PCB 101 may be mechanically mounted within or fastened onto the electronic device. In other implementations, however, PCB 101 may take a variety of forms and/or may include a plurality of other elements or components in addition to chip 100. Moreover, in some embodiments, PCB 101 may not be used, and chip 100 may be integrated with other components of the electronic device without PCB 101.

Examples of IC(s) include a System-On-Chip (SoC), an Application Specific Integrated Circuit (ASIC), a Digital Signal Processor (DSP), a Field-Programmable Gate Array (FPGA), a processor, a microprocessor, a controller, a Microcontroller Unit (MCU), or the like. Additionally, IC(s) may include a memory circuit or device such as a Random Access Memory (RAM) device, a Static RAM (SRAM) device, a Magnetoresistive RAM (MRAM) device, a Non-volatile RAM (NVRAM), and/or a Dynamic RAM (DRAM) device such as Synchronous DRAM (SDRAM), a Double Data Rate (DDR) RAM, an Erasable Programmable Read Only Memory (EPROM), an Electrically Erasable Programmable ROM (EEPROM), etc. IC(s) may also include one or more mixed-signal or analog circuits, such as, for example, Analog-to-Digital Converter (ADCs), Digital-to-Analog Converter (DACs), Phased Locked Loop (PLLs), oscillators, filters, amplifiers, etc.

As such, an IC within chip 100 may include a number of different portions, areas, or regions. These various portions may include one or more processing cores, cache memories, internal bus(es), timing units, controllers, analog sections, mechanical elements, etc. Thus, in various embodiments, IC(s) may include a circuit configured to receive one or more supply voltages (e.g., two, three, four, etc.).

Although the example of FIG. 1 shows electronic chip 100 in monolithic form, it should be understood that, in alternative embodiments, various systems and methods described herein may be implemented with discrete components. For example, in some cases, one or more discrete capacitors, inductors, transformers, transistors, registers, logic gates, etc. may be physically located outside of chip 100 (e.g., elsewhere on PCB 101).

Figure 2:
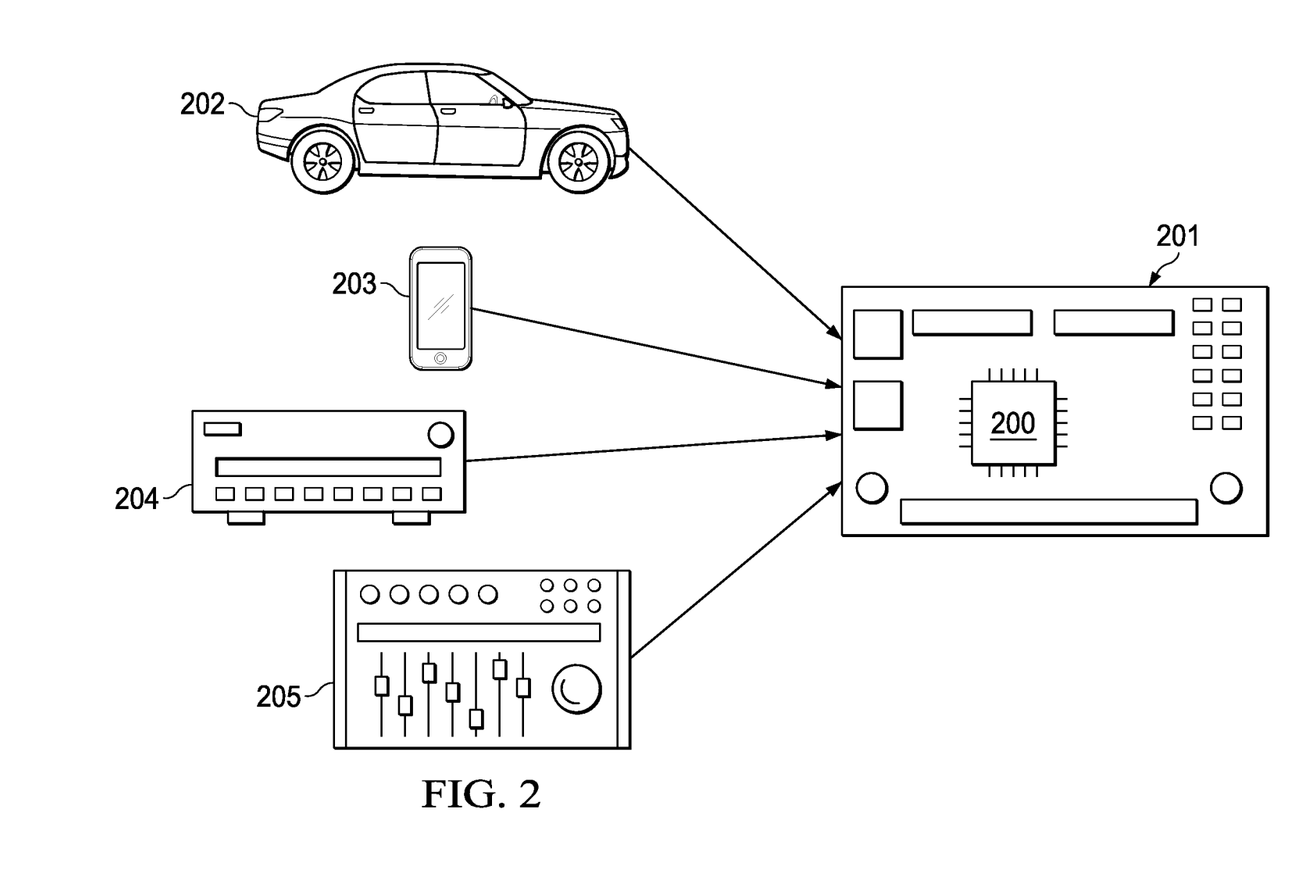
FIG. 2 is a diagram of examples of devices where systems and methods described herein may be implemented according to some embodiments.
Figure 3:
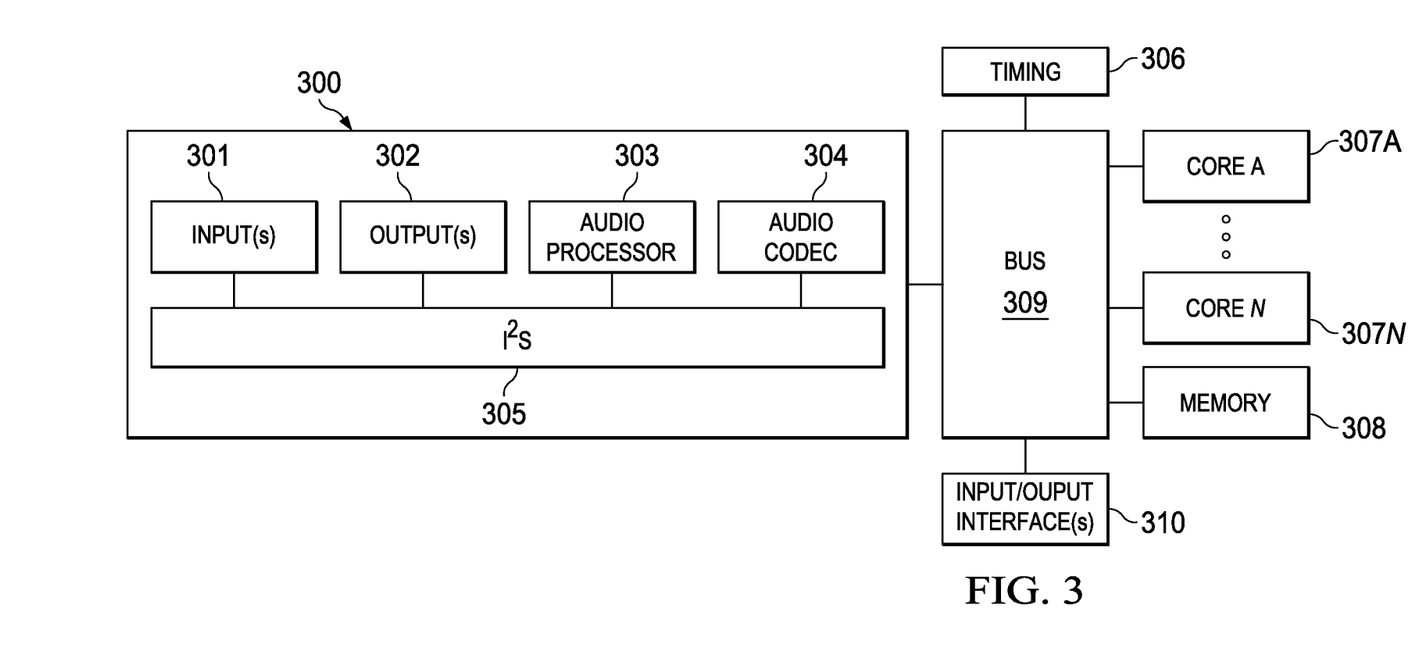
FIG. 3 is a block diagram of an example of an audio system according to some embodiments.

FIG. 2 is a block diagram of an example of IC 200 within chip 100. In some embodiments, IC 200 may include an electronic circuit configured to perform loudspeaker protection against excessive excursion. As illustrated, audio circuit 200 includes input(s) 201, output(s) 202, audio processor 203, and audio codec 204. Components 201-204 may be operably coupled to one another via Inter-IC Sound ($I^2S$) bus 205 or other suitable bus. Also, in some devices, audio circuit 200 may be coupled to timing circuit 206, processing cores 207A-N, memory 208, and/or input/output (I/O) interface(s) 210 via bus 209. In some cases, components 206-210 may be a part of another device (e.g., a computer, etc.) that is hosting audio circuit 200.

It should be noted that different bus standards may be used to facilitate communication between different ones of components 201-204 and/or between audio circuit 200 and components 206-210. Moreover, in some cases, one or more of components may be directly coupled to each other or embedded within each other (e.g., audio processor 203 may include audio codec 204). As such, it should be understood the particular configurations of audio circuit 200 and other components shown in FIG. 2 are provided for illustration purposes only, and that other configurations are possible.

In operation, audio processor 203 may act either independently or under command of processor core(s) 207A-N to control one or more of components 201-204 (e.g., via $I^2S$ 205) in order to implement certain systems and methods for loudspeaker protection against excessive excursion. Audio codec 204 may implement one or more algorithms that compress and/or decompress audio data according to a given audio file format or streaming media audio format.

In some embodiments, input(s) 201 and/or output(s) 202 may include, for example, ADCs, DACs, Phased Locked Loop (PLLs), oscillators, filters, amplifiers, etc. Particularly, input(s) 201 may include one or more analog or digital input circuits configured to receive and/or preprocess, analog or digital audio signals (e.g., from a microphone, a line-in connection, an optical source, an S/PDIF line, etc.). Conversely, output(s) 202 may include one or more analog or digital output circuits configured to provide or output analog or digital audio signals to other devices, such as, for example, a loudspeaker, headphone, a line-out connection, an optical line, an S/PDIF line, etc.).

Processor core(s) 207A-N may be any general-purpose or embedded processor(s) implementing any of a variety of Instruction Set Architectures (ISAs), such as the x86, RISC®, PowerPC®, ARM®, etc. In multi-processor systems, each of processor core(s) 210A-N may commonly, but not necessarily, implement the same ISA.

Memory 208 may include for example, a RAM, a SRAM, MRAM, a NVRAM, such as "FLASH" memory, and/or a DRAM, such as SDRAM, a DDR RAM, an EPROM, an EEPROM, etc.

Bus 209 may be used to couple master and slave components together, for example, to share data or perform other data processing operations. In various embodiments, bus 209 may implement any suitable bus architecture, including, for instance, Advanced Microcontroller Bus Architecture® (AMBA®), CoreConnect™ Bus Architecture™ (CCBA™), etc. Additionally or alternatively, bus 209 may be absent and timing circuit 206 or memory 208, for example, may be integrated into processor core(s) 207A-N.

In various embodiments, modules or blocks shown in FIG. 2 may represent processing circuitry, logic functions, and/or data structures. Although these modules are shown as distinct blocks, in other embodiments at least some of the operations performed by these modules may be combined in to fewer blocks. Conversely, any given one of the modules of FIG. 2 may be implemented such that its operations are divided among two or more logical blocks. Although shown with a particular configuration, in other embodiments these various modules or blocks may be rearranged according to other suitable embodiments.

When speakers coupled to output(s) 202 are damaged while playing, the usual reasons are: damage due to overheating of the speaker (thermal damage); or damage due to violation of the excursion threshold (mechanical damage). Systems and methods described herein protect the speaker by limiting the power that is dissipated into the speaker, and by restricting the movement of the membrane without causing audible artifacts. The various techniques described herein may be utilized in a feed forward fashion where the power level and the excursion model are predefined, or it can operate embedded in a feedback loop where the maximum power level is determined from a temperature estimate/measurement and the excursion model is estimated on the fly.

An algorithm may be developed using a number of separate mechanisms described herein to provide protection without causing audible artifacts, including: power limiting, model-based excursion protection, multiband processing, lossy watermark, and allocation between bands. These various mechanisms are discussed in turn below.

Power Limiter

A power limiter is a circuit that limits a signal to a maximum mean square value. This mean square value is defined by the system gain and the maximum power that the speaker can handle, or, if applicable, from a thermal estimation feedback system.

Figure 4:
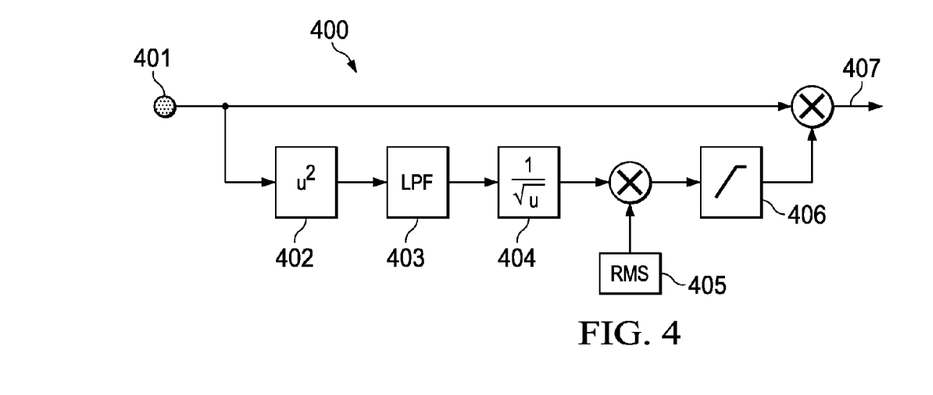
FIG. 4 is a block diagram of an example of a power limiter circuit according to some embodiments.

FIG. 4 is a block diagram of an example of power limiter circuit 400 according to some embodiments. Input signal 401 is provided to square circuit 402, which is coupled to low-pass filter (LPF) 403, and to inverse square root circuit 404. If the output of the inverse square block were multiplied to the input signal the result would be a signal with a mean square value equal to one. In order to get a power limiter with an adjustable threshold, the target root mean square 405 value is multiplied onto the inverse square root output 404. The result is then limited to +1 by block 406 to prevent the limiter from gaining up the signals before it is multiplied onto the input signal 401, thus resulting in output signal 407. The time constant of LPF 403 should be selected taking the dynamics of the thermal system in the speaker into account—that is, it should be significantly faster.

Model-Based Excursion Protection

A speaker may be approximated by a linear dynamic system. Therefore the movement of the membrane can be modeled by a transfer function with speaker terminal voltage as the input and the membrane displacement as the output.

Figure 5:
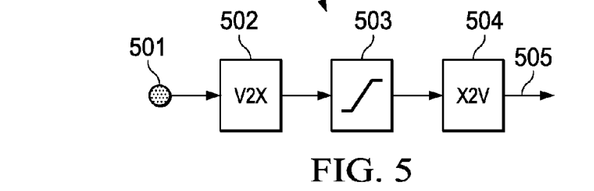
FIG. 5 is a block diagram of an example of an excursion transform circuit according to some embodiments.

Turning to FIG. 5, an example of excursion transform circuit 500 according to some embodiments. As shown, input signal 501 is provided to voltage-to-exclusion (V2X) transform block 502. As such, the audio signal is transformed form the linear (voltage) domain into the excursion domain. In the excursion domain, the signal is clipped by block 503 to comply with the excursion limit. Finally the clipped signal is transformed back into the voltage domain by applying the excursion-to-voltage (X2V) block 504 in order to get output signal 505 that can drive the speaker while guaranteeing that the excursion limits are not violated.

The V2X and X2V transfer functions may be defined upfront based on a speaker characterization or it may be estimated on the fly using a feed-back system. A non-limiting example of such a transfer function may be given by the following state space equations:

$$\frac{d}{dt}x = \begin{bmatrix} -\left(\frac{B_l^2}{R_e} + R_{ms}\right)\frac{1}{M_{ms}} & \frac{-1}{C_{ms}M_{ms}} \\ 1 & 0 \end{bmatrix} x + \begin{bmatrix} \frac{B_l}{M_{ms}}R_e \\ 0 \end{bmatrix} u; \text{ and}$$

$$y = [0 \quad 1]x + [0]u$$

Where system parameters include: speaker resistance ($R_e$); current-to-force factor ($B_l$); inverse spring constant, displacement to force ($C_{MS}$), moving mass ($M_{MS}$), and mechanical damping ($R_{MS}$). The transfer function has the terminal voltage as the input (u). The state variable x is two dimensional, with velocity as the first state and position as the second state. The output from the state space model is the position of the membrane, i.e., the excursion.

A potential problem with this approach is that it can generate audible artifacts when clipper 503 is active. But, to address this, a peak predictor may be used.

Figure 6:
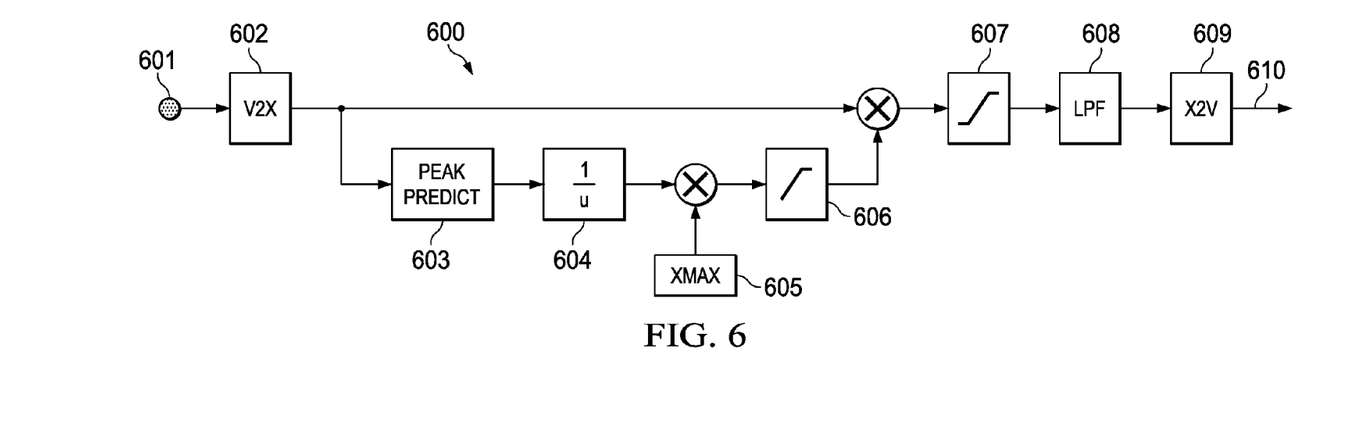
FIG. 6 is a block diagram of an example of an excursion limiting circuit with peak prediction according to some embodiments.

FIG. 6 is a block diagram of an example of an excursion limiting circuit with peak prediction according to some embodiments. As shown, input signal 601 is provided to V2X block 602, which is coupled to peak predictor 603, and which in turn is coupled to inverse block 604. Peak predictor 603 is used to normalize the signal level to the clipping threshold XMAX 605, thereby minimizing the clipping that actually occurs. The result is then limited to +1 by block 606, and multiplied by the original (transformed) signal 602. That is, clipping is limited to +/− the clipping threshold.

Similarly as in FIG. 5, the signal is clipped by block 607 to comply with the excursion limit, and low-pass filter 608 is inserted after clipping block 607 to suppress harmonics and intermodulation products caused by the clipper. Then, the output from LPF 608 is transformed back into the voltage domain by block 609 to result in output signal 610.

In some embodiments, peak detector 603 may be implemented using the equation given below:

PeakPredict(u)=peak2MeanAbs×mean(|u|)

Where the constant "peak2MeanAbs" defines an expected ratio between the mean abs of the signal and the peak value of the signal.

It should be noted that, in alternative implementations, it is possible to use a look-ahead technique instead of prediction to come up with the excursion level that we should adjust our attenuation to.

Multiband Processing

In various embodiments, multiband processing allows for a meaningful selection of cut off frequency for the before low-pass filter 608 and after the clipping operation. Specifically, clipping and other non-linear operations causes distortion and intermodulation (IM) when the input has more than one fundamental frequency. IM is particularly troublesome in reproduction of music, because it generates frequencies which were not present in the original music. Intermodulation products show up at linear integer combinations of the fundamental frequencies and the amplitude and phase depend on the non-linear function and the fundamental signals. The intermodulation order of an intermodulation component is defined as the sum of the absolute value of these integers. An example of a second order intermodulation frequency is $\omega_1-\omega_2$ and an example of a third order intermodulation frequency is $2\omega_2-\omega_1$. In general, lower order intermodulation products are more powerful.

Figure 7:
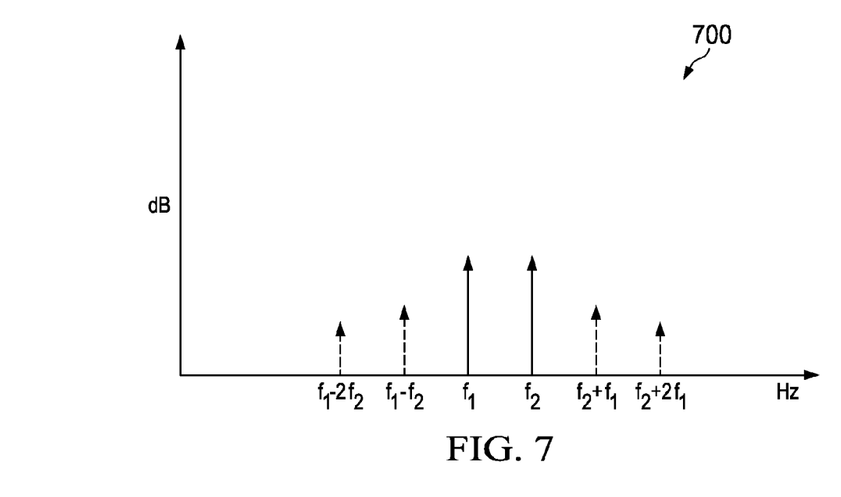
FIG. 7 is a graph illustrating an example of intermodulation products according to some embodiments.

FIG. 7 is a graph illustrating an example of intermodulation products 700 according to some embodiments. As illustrated, band splitting limits the distance between the fundamentals. This means that most of the lower order intermodulation products will fall outside the band and can be filtered out thereby improving the listening experience. Moreover, the use of separated frequency bands provides a mechanism for prioritizing the resources (in terms of power and excursion) when the algorithm is active.

Lossy Watermark

Over-active limiters can cause audible artifacts in the music when high attenuation is applied dynamically to limit the signal. To address this, in some embodiments, an algorithm may applied a "lossy watermark" mechanism. Traditionally the problem has been handled by using filters with a programmable attack/decay time, usually by applying a short attack time (the time the protection take to kick in) and a long decay time (the time the protection take to relax back to unity). However, the long decay can be very audible and reduce the overall loudness of the system unnecessary.

The lossy watermark (LW) approach is somewhat different; the block remembers the maximum input attenuation that has been applied. The output attenuation is only allowed to relax back to a certain level above the maximum attenuation, not back to unity. The maximum attenuation level is remembered for a period of time, after this period the blocks starts to forget (i.e., starts to decay towards unity). This limits the activity while allowing the protection to kick in and relax back (to a certain level) fast, thereby providing a louder output than if the attack/decay approach gives.

Figure 8:
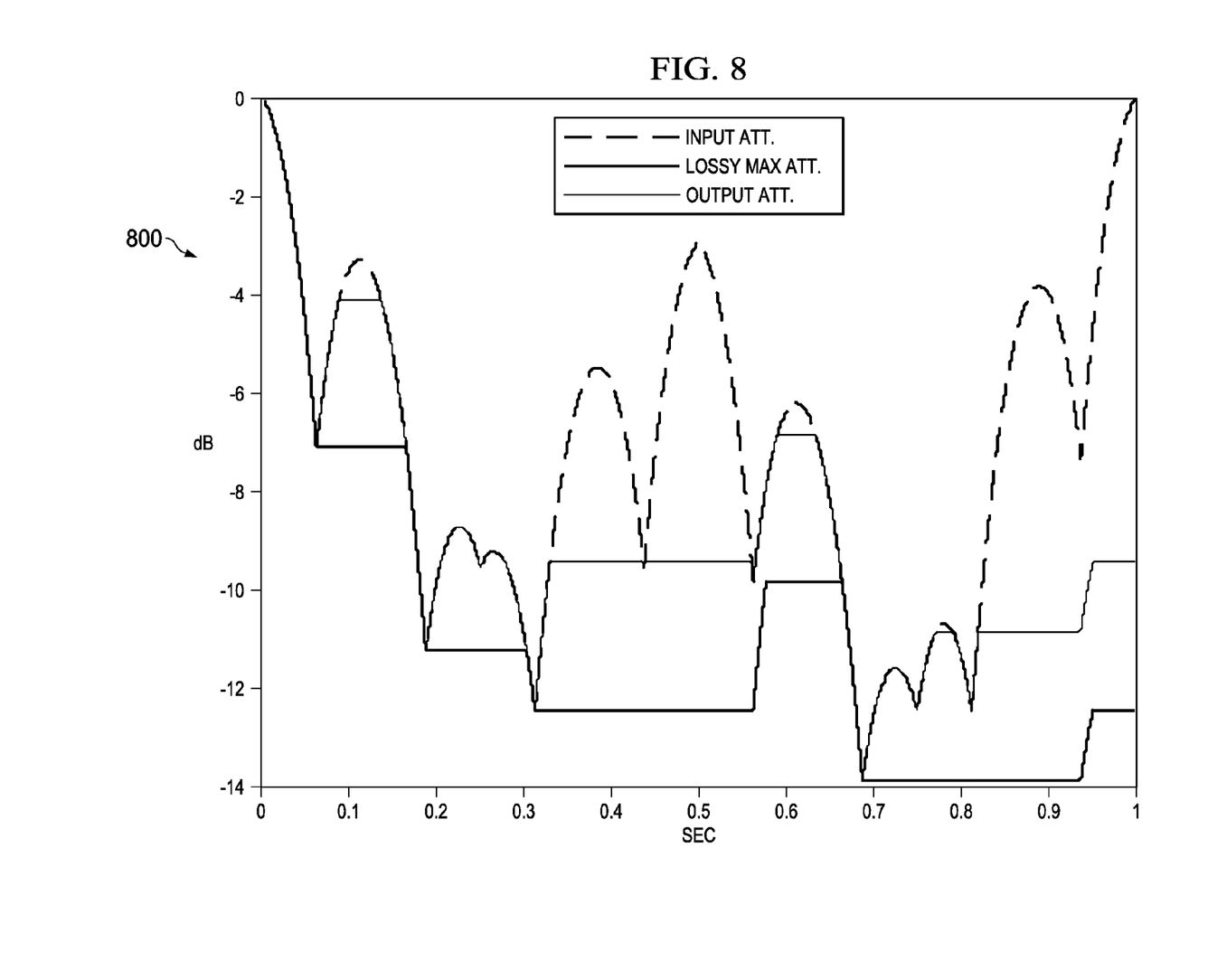
FIG. 8 is a graph illustrating an example of a lossy watermark technique according to some embodiments.

FIG. 8 is a graph illustrating an example of a lossy watermark technique according to some embodiments. The "input att." curve corresponds to the attenuation required by the limiter, i.e., the input to the LW. The "lossy max att." curve is the lossy maximum attenuation that provides information about how much attenuation that has been applied recently. This signal tracks the input attenuation when a maximum attenuation is applied and will start to forget about this after a period of time. The "output att." curve tracks the input attenuation but is not allowed to be more than a specific amount above maximum attenuation. In this example the specific amount is set to be 3 dB.

The behavior around 0.2 second illustrates the difference between LW and traditional attack/decay solution. The LW allows the attenuation to jump back immediately tracking the input attenuation, in an attack/decay approach the jump back would be slowed down by the decay. The implementation of the mechanism for forgetting the maximum attenuation may vary—in its simplest form it may take the minimum of the n preceding sample values.

Algorithm Overview

Figure 9:
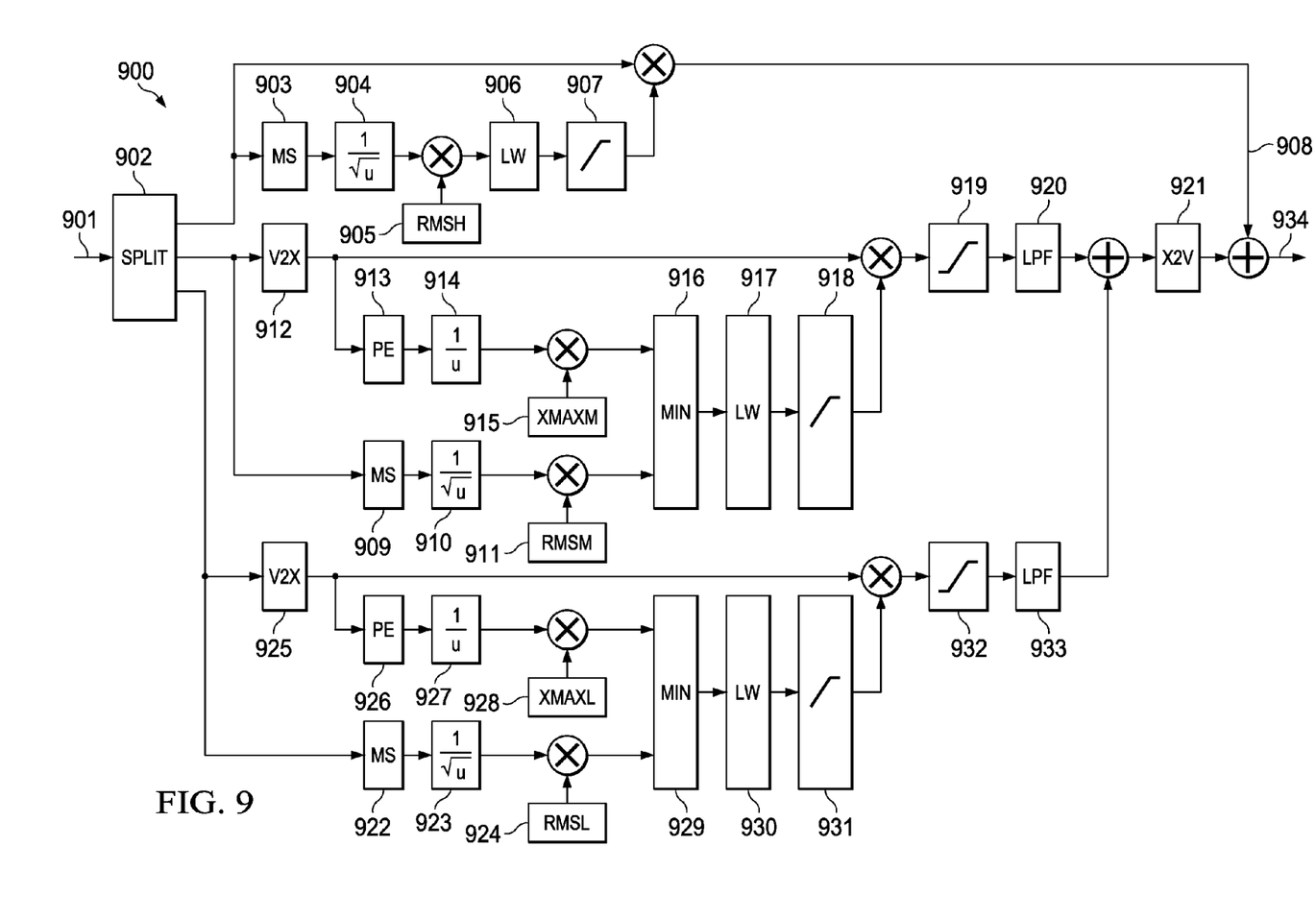
FIG. 9 is a block diagram of an example of a multi-band loudspeaker protection circuit according to some embodiments.

FIG. 9 is a block diagram of an example of a multi-band loudspeaker protection circuit according to some embodiments. This example shows a three band implementation, although any other number of bands may be used in other embodiments. Input signal 901 goes through band split filter 902, which splits the signal into three distinct frequency bands—high, medium, and low.

The high frequency band processing, in this embodiment, is performed entirely in the voltage domain. The medium and low frequency bands are processed both in the voltage and excursion domains. Generally speaking, circuit 900 independently selects between a power attenuation or an excursion attenuation for each of these two bands, and independently applies the selected attenuation to its respective band. The resulting signals from the high, medium, and low frequency bands are then combined into an output signal that can be safely delivered to a loudspeaker to prevent excessive excursions and without causing undesirable audio clipping artifacts.

In the high-frequency band, processing begins with mean square (MS) block 903, which is coupled to inverse square root block 904, the output of which is multiplied by a target root mean square value RMSH 905. Lossy watermark block 906 is applied, and then the result clipped by block 907 to comply with the excursion limit, producing output signal 908.

In the middle frequency band, the voltage path receives the split middle band signal at MS block 909, which is coupled to inverse square block 910 and RMSM block 911. In the excursion domain, V2X block 912 also receives the split middle band signal. V2X block 912 is coupled to peak estimator 913, which is coupled to inverse block 914 and the allowed excursion for that band XMAXM 915. Selector block 916 selects the most conservative of the power and the excursion attenuation, and feeds that into LW block 917. that reduces the attenuation swing in order to avoid audible artifacts. The output of the LW block 917 goes through clipper block 918, which saturates the signal to +1 if it is above to ensure that the system never gains the signal before the attenuation is applied to the signal in the band.

The processing of blocks 919-921 is similar to that performed by blocks 607-609 of FIG. 6. Particularly, the attenuated signal is fed into clipper 919, that will clip any signal to the range given by the maximum allowed excursion (−xmax1 to +xmax1). The low pass filter (LPF) 920 cascading clipper 919 suppresses the intermodulation products due to clipping that falls outside the band's frequency span. Finally, the signal is added to the signal from the other bands and converted from the excursion domain back into the linear domain in the excursion to voltage filter (V2X) 921.

Processing in the low frequency band is similar to that of the middle frequency band, with elements 922-933 corresponding to elements 909-920. In the low-frequency band path, block 924 includes a target root mean square value and block 928 includes a target excursion for that band.

The output is given by signal 934. Here it should be noted that excursion protection is not being applied to the upper band; which is possible provided that the frequency span of this band is high enough that the excursion consumed in this band is low compared to the total excursion allowed.

Frequency Band Allocation

In the foregoing algorithm, the amount of resources dedicated to each band is fixed. The resources dedicated to each band have to sum up to the level that can be tolerated by the speaker, meaning that the amount dedicated to each band has to be below the total. Consequently, the algorithm prevents the system from for example delivering full power if the signal is limited to one of the frequency bands.

Figure 10:
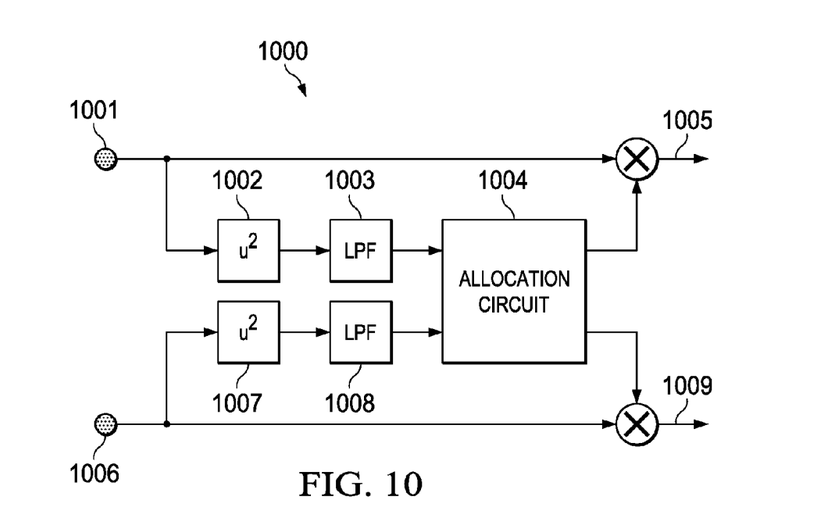
FIGS. 10 and 11 are block diagrams of examples of allocation circuits according to some embodiments.
Figure 11:
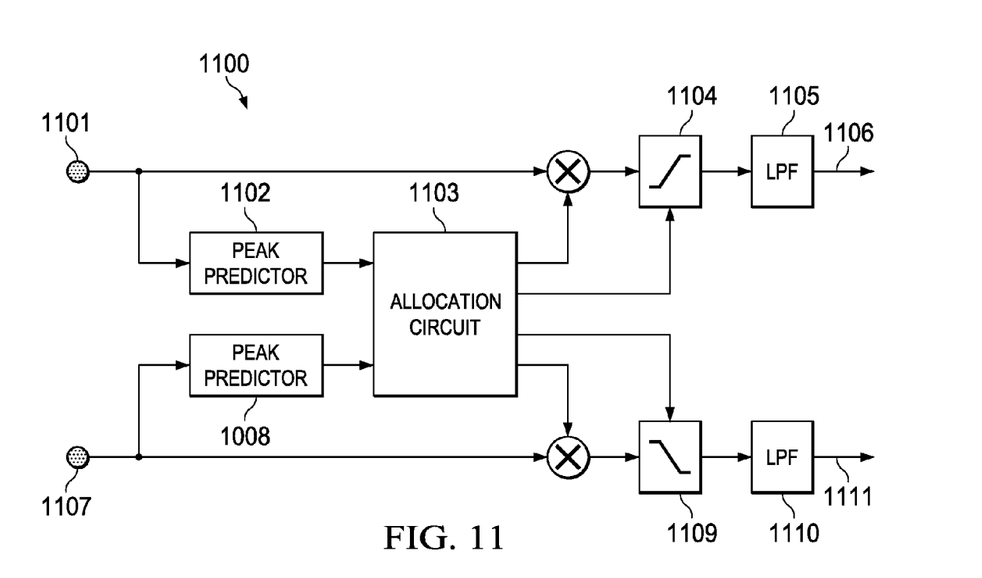

FIGS. 10 and 11 are block diagrams of examples of allocation circuits according to some embodiments. Voltage domain topology 1000 is given for a two-band power limited system, although any other number of bands may be used. Signals 1001 and 1006 in each of two bands go trough their respective square blocks 1002 and 1007 and low-pass filters 1003 and 1008. The filtered signals are then fed into allocation block 1004, which monitors the mean square for the signal in each band and uses this to define a attenuation for each band thereby effectively controlling the amount of power that is allocated to each band.

Allocation block 1004 ensures that the total power sums up to a level below what the speaker can tolerate. For example, the allocation function may be defined as follows:

$$patt_{band} = \min\left(1, \frac{rms_{band}}{\sqrt{MS(u_{band})}}\right) \times \min\left(1, \frac{rms_{total}}{\sqrt{\sum_k \min(rms_k^2, MS(u_k))}}\right)$$

Where $patt_{band}$ is the attenuation that is applied to the band due to power protection, min( ) is a minimum function, $rms_{band}$ is the square root of the mean square value allocated for the band, MS( ) is mean square value of the input parameter $u_{band}$ is the signal in the band, $rms_{total}$ is the square root of the total mean square value that can be tolerated by the speaker, $rms_k$: is the square root of the mean square value allocated for the band 'k', and $u_{band}$: the signal in band 'k.'

In this scheme each band is allocated a fixed amount of power defined by the allocated rmsband. The first term (before the multiplier) ensures that the power relayed through this band is limited to this amount. The second term (after the multiplier) is common to all bands and can be understood as a reallocation between the bands that will reduce all bands proportional when the total power exceeds what amount that the speaker can handle.

In excursion domain topology 1100, peak predictors 1102 and 1108 are applied to signals 1101 and 1107, respectively, before being fed into allocation block 1103. Each path also includes its own clipper 1104 and 1109 and LPF 1105 and 1110, before producing output signals 1109 and 1111. In this construction the allocation function may control the attenuation in each band as well as the actual saturation level. Again the allocation function ensures that the excursion allocated to each band summarizes up to an amount below or equivalent to the total excursion that the speaker can tolerate. For example, such an allocation function may be defined as follows:

$$xatt_{band} = \min\left(1, \frac{xmax_{band}}{PeakPredict(u_{band})}\right) \times$$

$$\min\left(1, \frac{xmax_{total}}{\sqrt{\sum_k \min(xmax_k, \text{Peak Predict}(u_k))}}\right)$$

Where $xatt_{band}$ is the attenuation that is applied to the band due to excursion protection, $xmax_{band}$ is the excursion level that is allocated to the band, and $xmax_{total}$ is the total excursion level that the speaker can tolerate. Meanwhile, the corresponding saturation level may be calculated as follows:

$$xsat_{band} = \min(xmax_{band}, PeakPredict(u_{band})) \times$$

$$\frac{xmax_{total}}{\sqrt{\sum_{k=low \ldots high} \min(xmax_k, PeakPredict(u_k))}}$$

Where $xsat_{band}$ is the clipping level in the excursion control.

It should be understood that the various operations described herein, particularly in connection with FIGS. 4-6 and 9-11, may be implemented by processing circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

A person of ordinary skill in the art will appreciate that the various circuits depicted above are merely illustrative and is not intended to limit the scope of the disclosure described herein. In particular, a device or system configured to perform audio power limiting based on thermal modeling may include any combination of electronic components that can perform the indicated operations. In addition, the operations performed by the illustrated components may, in some embodiments, be performed by fewer components or distributed across additional components. Similarly, in other embodiments, the operations of some of the illustrated components may not be provided and/or other additional operations may be available. Accordingly, systems and methods described herein may be implemented or executed with other circuit configurations.

It will be understood that various operations discussed herein may be executed simultaneously and/or sequentially. It will be further understood that each operation may be performed in any order and may be performed once or repetitiously.

Many modifications and other embodiments of the invention(s) will come to mind to one skilled in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method useable in an audio system including a loudspeaker, comprising:
    splitting an input signal into two or more input voltage-domain signals, each of the two or more input voltage-domain signals within a pre-determined frequency band;
    in each frequency band,
        converting the input voltage domain signal into an excursion domain signal in an excursion domain for the associated frequency band,
        applying a power attenuation to the input voltage-domain signal to generate a power attenuation signal,
        applying an excursion attenuation to the excursion domain signal to generate an excursion attenuation signal,
        selecting the power attenuation signal or the excursion attenuation signal as a selected attenuation signal for the frequency band, and
        attenuating the excursion domain signal with the selected attenuation signal to generate an attenuated excursion domain signal for the frequency band;
    combining the attenuated excursion domain signals for each of the frequency bands into an output attenuated excursion domain signal;
    converting the output attenuated excursion domain signal from the excursion domain to the voltage domain to generate an output excursion protected signal; and
    providing the output excursion protected signal to the loudspeaker.

2. The method of claim 1, wherein converting the input voltage domain signal into an excursion domain signal in an excursion domain is accomplished using a transform operation.

3. The method of claim 1, wherein, in each frequency band, selecting between the power attenuation signal or the excursion attenuation signal comprises:
    for the power attenuation signal, calculating an inverse root mean square of the input voltage domain signal and multiplying it by a target root mean square value;
    for the excursion attenuation signal, calculating an inverse peak excursion estimate for the excursion domain signal and multiplying it by a target excursion for the given frequency band; and
    selecting the power attenuation signal or the excursion attenuation signal based on the smallest calculated value.

4. The method of claim 1, further comprising:
    splitting the input signal into an input upper-band voltage-domain signal for a pre-determined upper frequency band, in addition to the two or more input voltage-domain signals, the pre-determined upper frequency band being above the frequency bands for the two or more input voltage domain signals;
    applying a power attenuation to the input upper-band voltage-domain signal to generate an upper-band power attenuation signal; and
    combining the upper-band power attenuation signal with the output excursion protected signal.

5. The method of claim 1, further comprising:
    in each frequency band, applying a lossy watermark attenuation to the selected attenuation signal to reduce an attenuation swing.

6. The method of claim 5, further comprising, after lossy watermark attenuation, applying clipping to avoid applying gain to the selected attenuation signal.

7. The method of claim 1, further comprising:
in each band, clipping the output attenuated excursion domain signal to a range based on a pre-defined maximum allowed excursion.

8. The method of claim 7, further comprising, after clipping, applying low pass filtering to suppress an intermodulation product falling outside the frequency band.

9. The method of claim 7, further comprising allocating a power level for each frequency band by:
monitoring,
for the input voltage domain signal, an RMS (root mean square) power, and
for the excursion-domain signal, a peak excursion value; and
generating a power protection attenuation allocation for each frequency band based on the monitored RMS power for each band; and
generating an excursion protection attenuation allocation for each frequency band, including generating an allocated saturation level for clipping the output attenuated excursion domain signal.

10. A circuit used in a system including an audio source for an input audio voltage signal, and a loudspeaker, the circuit comprising:
a signal splitter to split the input audio voltage signal into two or more input voltage domain signals, each of the two or more input voltage domain signals within a pre-determined frequency band;
an audio codec to convert the two or more input voltage domain signals into corresponding voltage domain data for the respective frequency band;
an audio processor to process the voltage domain data for each frequency band, including:
to perform a voltage-to-excursion domain conversion of the voltage domain data to obtain corresponding excursion domain data associated with the frequency band,
to apply a power attenuation to the voltage domain data to generate power attenuation data,
to apply an excursion attenuation to the excursion domain data to generate excursion attenuation data,
to select the power attenuation data or the excursion attenuation data as selected attenuation data for the frequency band,
to attenuate the excursion domain data with the selected attenuation data to generate attenuated excursion domain data for the frequency band,
to combine the attenuated excursion domain data for each of the frequency bands into output attenuated excursion domain data, and
to perform an excursion-to-voltage domain conversion of the output excursion domain data from the excursion domain to the voltage domain to generate output excursion protected data;
the audio codec to convert the output excursion protected data into audio output signals.

11. The circuit of claim 10, wherein the audio processor performs the voltage-to-excursion domain conversion using a transform operation.

12. The circuit of claim 10, wherein, for each frequency band, the audio processor selects the power attenuation data or the excursion attenuation data as selected attenuation data for the frequency band by:

for the power attenuation data, calculating an inverse root mean square for the voltage domain data, and multiplying it by a target root mean square value;
for the excursion attenuation data, calculating an inverse peak excursion estimate for excursion domain data and multiplying it by a target excursion for the frequency band; and
select the power attenuation data or the excursion attenuation data based on the smallest calculated value.

13. The circuit of claim 10, wherein
the signal splitter splits the input audio voltage signal into an input upper-band voltage domain signal for a pre-determined upper frequency band, in addition to the two or more input voltage domain signals, the pre-determined upper frequency band being above the frequency bands for the two or more input voltage-domain signals;
the audio codec converts the upper-band voltage domain signal into corresponding upper-band voltage domain data for the respective upper frequency band;
the audio processor
applies a power attenuation to the upper-band voltage domain data to generate upper-band power attenuation data, and
combines the upper-band power attenuation data with the output excursion protected data.

14. The circuit of claim 10, wherein the audio processor:
clips the output attenuated excursion domain data to a range based on a pre-defined maximum allowed excursion; and then
low pass filters the clipped output attenuated excursion domain data to suppress an intermodulation product falling outside of each signal's frequency band.

15. The circuit of claim 10, wherein the audio processor:
allocates a power level for each frequency band by monitoring,
for the input voltage domain signal, RMS (root mean square) power, and
for the excursion-domain signal, peak excursion value; and
generates an power protection attenuation allocation for each frequency band based on the monitored RMS power for each band;
generates an excursion protection attenuation allocation for each frequency band, including generating an allocated saturation level for clipping the output attenuated excursion domain signal.

16. An audio system including a loudspeaker, comprising:
an audio voltage signal source
a signal splitter to split the input audio voltage signal into two or more input voltage domain signals, each of the two or more input voltage domain signals within a pre-determined frequency band;
an audio codec to convert the two or more input voltage domain signals into corresponding voltage domain data for the respective frequency band;
an audio processor to process the voltage domain data for each frequency band:
to transform the voltage domain data into corresponding excursion domain data associated with the frequency band;
to apply a power attenuation to the voltage domain data to generate power attenuation data,
to apply an excursion attenuation to the excursion domain data to generate excursion attenuation data, to select the power attenuation data or the excursion attenuation data as selected attenuation data for the frequency band, to attenuate the excursion domain data with the selected attenuation data to generate attenuated excursion domain data for the frequency band, to combine the attenuated excursion domain data for each of the frequency bands into output attenuated excursion domain data, and to transform the output attenuated excursion domain data from the excursion domain to the voltage domain to generate output excursion protected data;

the audio codec to convert the output excursion protected data into audio output signals for output to the loudspeaker.

17. The audio system of claim 16, wherein, for each frequency band, the audio processor selects the power attenuation data or the excursion attenuation data as selected attenuation data for the frequency band by:

for the power attenuation data, calculating an inverse root mean square for the voltage domain data, and multiplying it by a target root mean square value;

for the excursion attenuation data, calculating an inverse peak excursion estimate for excursion domain data and multiplying it by a target excursion for the given audio signal's frequency band; and select the power attenuation data or the excursion attenuation data based on the smallest calculated value.

18. The audio system of claim 16, wherein the signal splitter splits the input audio voltage signal into an input upper-band voltage domain signal for a pre-determined upper frequency band, in addition to the two or more input voltage domain signals, the pre-determined upper frequency band being above the frequency bands for the two or more input voltage-domain signals;

the audio codec converts the upper-band voltage domain signal into corresponding upper-band voltage domain data for the respective upper frequency band;

the audio processor applies a power attenuation to the upper-band voltage domain data to generate upper-band power attenuation data, and combines the upper-band power attenuation data with the output excursion protected data.

19. The audio system of claim 16, wherein the audio processor clips the output attenuated excursion domain data to a range based on a pre-defined maximum allowed excursion; and then low pass filters the clipped output attenuated excursion domain data to suppress an intermodulation product falling outside of each signal's frequency band.

20. The audio system of claim 16, wherein the audio processor:

allocates a power level for each frequency band by monitoring, for the input voltage domain signal, RMS (root mean square) power, and for the excursion-domain signal, peak excursion value; and generates an power protection attenuation allocation for each frequency band based on the monitored RMS power for each band;

generates an excursion protection attenuation allocation for each frequency band, including generating an allocated saturation level for clipping the output attenuated excursion domain signal.

* * * * *